US012696387B2

(12) United States Patent
Lin et al.

(10) Patent No.: US 12,696,387 B2
(45) Date of Patent: Jul. 28, 2026

(54) CONDUCTIVE FILM AND MANUFACTURING METHOD THEREOF

(71) Applicant: SAN FANG CHEMICAL INDUSTRY CO., LTD., Kaohsiung City (TW)

(72) Inventors: Chih-Yi Lin, Kaohsiung City (TW); Kuo-Kuang Cheng, Kaohsiung City (TW); Chi-Chin Chiang, Kaohsiung City (TW); Wen-Hsin Tai, Kaohsiung City (TW); I-Ju Wu, Kaohsiung City (TW); Chi-Ho Tien, Kaohsiung City (TW)

(73) Assignee: SAN FANG CHEMICAL INDUSTRY CO., LTD., Kaohsiung City (TW)

( * ) Notice: Subject to any disclaimer, the term of this patent is extended or adjusted under 35 U.S.C. 154(b) by 0 days.

(21) Appl. No.: 18/632,963

(22) Filed: Apr. 11, 2024

(65) Prior Publication Data

US 2024/0260183 A1 Aug. 1, 2024

Related U.S. Application Data

(62) Division of application No. 17/333,972, filed on May 28, 2021, now Pat. No. 11,991,823.

(30) Foreign Application Priority Data

Jun. 5, 2020 (TW) ................................. 109119104

(51) Int. Cl.
*H05K 1/03* (2006.01)
*B29C 48/00* (2019.01)
(Continued)
(52) U.S. Cl.
CPC ......... *H05K 1/036* (2013.01); *B29C 48/0021* (2019.02); *B29C 48/022* (2019.02);
(Continued)

(58) Field of Classification Search
CPC ..................................................... H05K 1/036
See application file for complete search history.

(56) References Cited

U.S. PATENT DOCUMENTS

| | | | | |
|---|---|---|---|---|
| 2010/0279086 A1* | 11/2010 | Park | ...................... | D06N 3/183 |
| | | | | 156/60 |
| 2012/0177934 A1* | 7/2012 | Vogel | ...................... | H01M 4/13 |
| | | | | 977/734 |

(Continued)

FOREIGN PATENT DOCUMENTS

| | | |
|---|---|---|
| CN | 101542039 A | 9/2009 |
| DE | 19614091 A1 | 10/1997 |

(Continued)

OTHER PUBLICATIONS

Bemis Seam Tape Selector Guide (Year: 2024).*

(Continued)

*Primary Examiner* — Michael M Dollinger
(74) *Attorney, Agent, or Firm* — WPAT, PC

(57) ABSTRACT

The present disclosure is relates to a conductive film and a manufacturing method thereof. The conductive film includes a base layer, a TPU complex layer, a conductive layer and a TPU surface layer. The TPU complex layer includes a TPU heat-resistant layer and a TPU melting layer. The TPU heat-resistant layer is disposed on the TPU melting layer, and the TPU melting layer is disposed on the base layer. The conductive layer includes a conductive circuit disposed on the TPU heat-resistant layer. The TPU surface layer is disposed on the conductive layer. Utilizing the TPU complex layer, the conductive layer does not contact directly with the base layer to avoid breaking the conductive line of the conductive layer when the base layer is pulled. Therefore, the lifetime of the conductive film can be increased.

8 Claims, 2 Drawing Sheets

(51) Int. Cl.
    *C08L 75/04*          (2006.01)
    *C09D 11/52*          (2014.01)
    *B29K 75/00*          (2006.01)

(52) U.S. Cl.
    CPC .............. *C08L 75/04* (2013.01); *C09D 11/52*
           (2013.01); *B29K 2075/00* (2013.01); *B29K*
           *2995/0016* (2013.01); *C08L 2207/04* (2013.01)

(56)              References Cited

U.S. PATENT DOCUMENTS

2016/0007475 A1*   1/2016   Zanesi ....................... B41J 2/01
                                          427/98.5
2016/0130471 A1*   5/2016   Burrows .............. H05K 1/0326
                                          252/514
2017/0100300 A1*   4/2017   Rapp .................... A61B 5/6828
2018/0020936 A1*   1/2018   Kwon ...................... H01B 5/14
                                          600/388

2018/0090861 A1*   3/2018   Lamontia ............... H05K 1/038
2018/0132350 A1*   5/2018   Wolfe .................... C08J 7/0427
2019/0013111 A1*   1/2019   Yonekura ................. H01B 1/02
2020/0115564 A1*   4/2020   Liang ......................... C09J 7/10
2021/0385947 A1*   12/2021   Lin ......................... B29C 48/21

FOREIGN PATENT DOCUMENTS

EP          2412508 A1     2/2012
TW       201718269 A   *   6/2017
WO    WO-2019187611 A1   *   10/2019

OTHER PUBLICATIONS

Deutsches Patent Office, "Examination Report from the DPMA for the corresponding DE patent application No. 102021113740.3" issued on Apr. 17, 2025, Deutsches Patent Office.

* cited by examiner

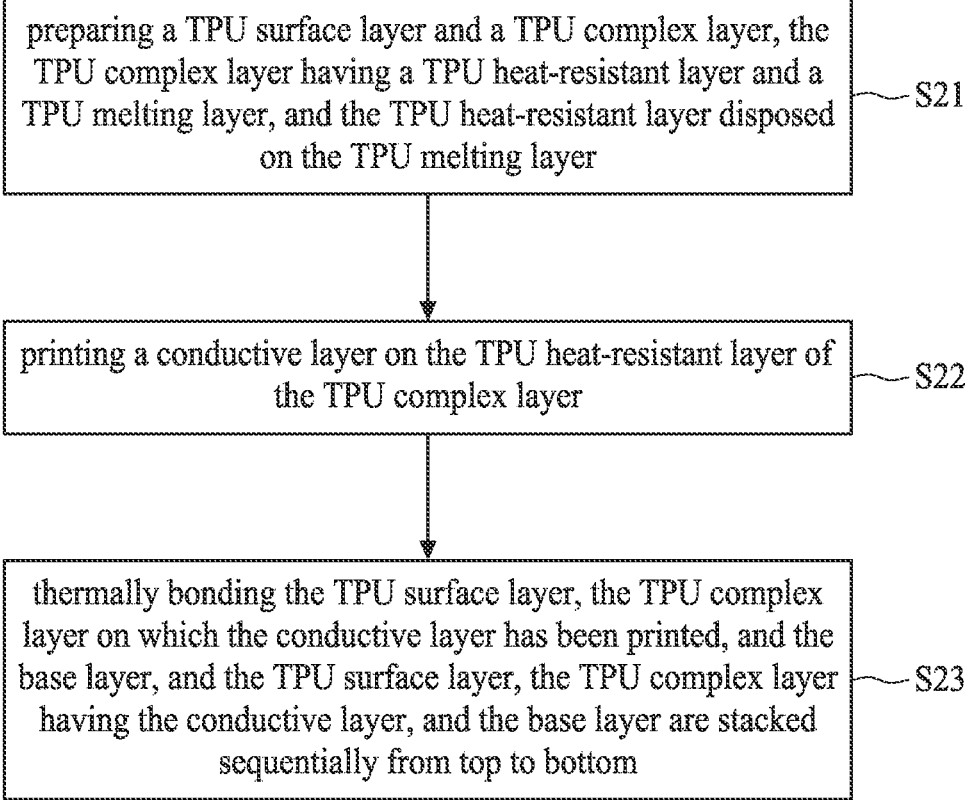

preparing a TPU surface layer and a TPU complex layer, the TPU complex layer having a TPU heat-resistant layer and a TPU melting layer, and the TPU heat-resistant layer disposed on the TPU melting layer — S21 printing a conductive layer on the TPU heat-resistant layer of the TPU complex layer — S22 thermally bonding the TPU surface layer, the TPU complex layer on which the conductive layer has been printed, and the base layer, and the TPU surface layer, the TPU complex layer having the conductive layer, and the base layer are stacked sequentially from top to bottom — S23

FIG. 2

CONDUCTIVE FILM AND MANUFACTURING METHOD THEREOF

FIELD

The disclosure relates to a conductive film and a manufacturing method thereof.

BACKGROUND

In a current smart clothing module, after the user wears or washes it, a conductive line often breaks. This is because that the conductive line is often directly printed on cloth fibers, which causes that the conductive line contacts directly with the cloth fibers, and in the wearing process of the user or in the washing process of the clothing, the cloth fibers may be pulled, which easily breaks the conductive line.

SUMMARY OF THE INVENTION

In accordance with one aspect of the present disclosure, a conductive film includes: a base layer, a thermoplastic polyurethane (TPU) complex layer, a conductive layer and a TPU surface layer. The TPU complex layer includes a TPU heat-resistant layer and a TPU melting layer. The TPU heat-resistant layer is disposed on the TPU melting layer, and the TPU melting layer is disposed on the base layer. The conductive layer includes a conductive circuit, and the conductive circuit is disposed on the TPU heat-resistant layer of the TPU complex layer. The TPU surface layer is disposed on the conductive layer.

In accordance with another aspect of the present disclosure, a manufacturing method of a conductive film includes: preparing a TPU surface layer and a TPU complex layer, the TPU complex layer having a TPU heat-resistant layer and a TPU melting layer, and the TPU heat-resistant layer disposed on the TPU melting layer; printing a conductive layer on the TPU heat-resistant layer of the TPU complex layer; and thermally bonding the TPU surface layer, the TPU complex layer on which the conductive layer has been printed, and the base layer, and the TPU surface layer, the TPU complex layer having the conductive layer, and the base layer are stacked sequentially from top to bottom.

BRIEF DESCRIPTION OF THE DRAWINGS

Aspects of the present disclosure are understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

FIG. 2 shows a flowchart of a manufacturing method of a conductive film according to an embodiment of the present invention.

DETAILED DESCRIPTION OF THE INVENTION

Figure 1:
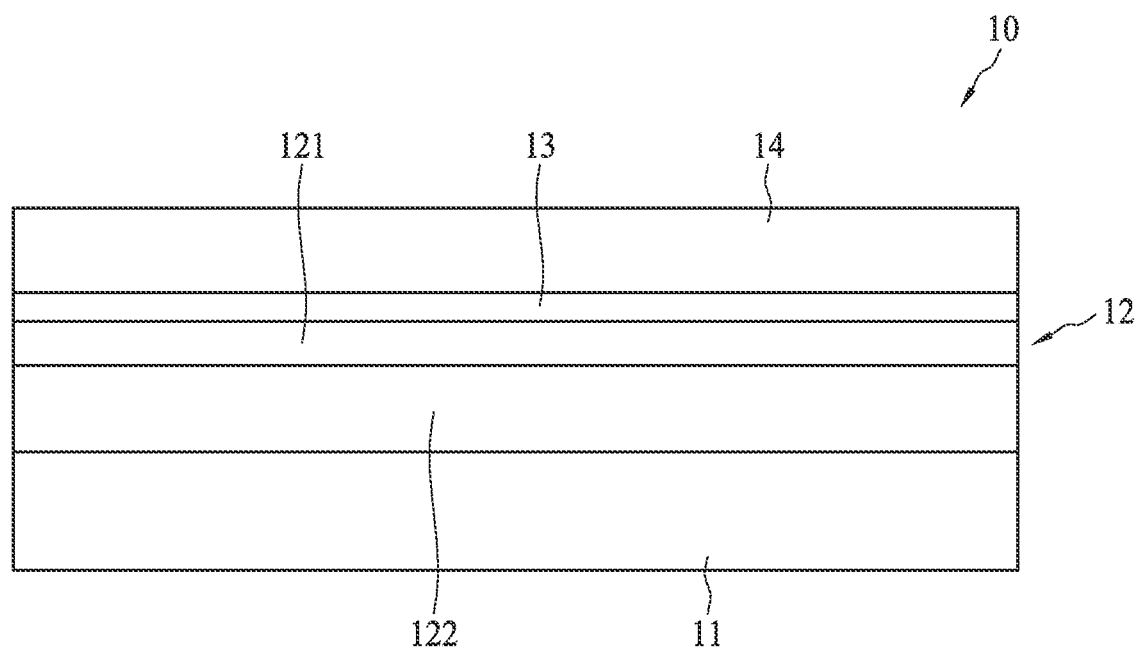
FIG. 1 is a schematic structural diagram showing a conductive film according to an embodiment of the present invention.

It is to be understood that the following disclosure provides many different embodiments or examples, for implementing different features of various embodiments. Specific examples of components and arrangements are described below to simplify the present disclosure. The present disclosure may however, be embodied in many different forms and should not be construed as being limited to the embodiments set forth herein; rather, these embodiments are provided so that this description will be thorough and complete, and will fully convey the present disclosure to those of ordinary skill in the art. It will be apparent, however, that one or more embodiments may be practiced without these specific details.

In addition, the present disclosure may repeat reference numerals and/or letters in the various examples. This repetition is for the purpose of simplicity and clarity and does not in itself dictate a relationship between the various embodiments and/or configurations discussed.

It will be understood that when an element is referred to as being "on" another element, it can be directly on the other element or intervening elements may be present. In contrast, when an element is referred to as being "directly on" another element, there are no intervening elements present.

It will be understood that singular forms "a", "an" and "the" are intended to include the plural forms as well, unless the context clearly indicates otherwise.

Unless otherwise defined, all terms (including technical and scientific terms) used herein have the same meaning as commonly understood by one of ordinary skill in the art to which this invention belongs. It will be further understood that terms; such as those defined in commonly used dictionaries, should be interpreted as having a meaning that is consistent with their meaning in the context of the relevant art and the present disclosure, and will not be interpreted in an idealized or overly formal sense unless expressly so defined herein.

Referring to FIG. 1, it is a schematic structural diagram showing a conductive film according to an embodiment of the present invention. In an embodiment, the conductive film 10 of the present invention includes: a base layer 11, a thermoplastic polyurethane (TPU) complex layer 12, a conductive layer 13 and a TPU surface layer 14. The conductive film 10 of the present invention may be applied to a smart clothing module, but is not limited to the above.

In an embodiment, the base layer 11 may be a woven fabric layer, a non-woven fabric layer or a mesh fabric layer, or may be a material that is selected according to actual needs to satisfy actual applications.

In an embodiment, the TPU complex layer 12 includes a TPU heat-resistant layer 121 and a TPU melting layer 122. The TPU heat-resistant layer 121 is disposed on the TPU melting layer 122, and the TPU melting layer 122 is disposed on the base layer 11. In an embodiment, the TPU heat-resistant layer 121 has heat resistance, flexibility, abrasion resistance, high tensile strength and high extensibility. The TPU melting layer 122 has resilience and washing resistance.

In an embodiment, the thickness of the TPU heat-resistant layer 121 may be 0.05-0.10 mm, and the thickness of the TPU heat-resistant layer 121 may be 0.05 mm. The thickness of the TPU melting layer 122 may be 0.10-0.20 mm, and the thickness of the TPU melting layer 122 may be 0.1 mm.

In an embodiment, the TPU heat-resistant layer 121 further includes a polar functional group bond (not shown), which is disposed on one surface of the TPU heat-resistant layer 121.

In an embodiment, the conductive layer 13 includes a conductive circuit (not shown), and the conductive circuit is disposed on the TPU heat-resistant layer 121 of the TPU complex layer 12. In an embodiment, the conductive circuit is a conductive ink circuit and has extensibility. In an embodiment, the conductive ink circuit is disposed on the polar functional group bond of the TPU heat-resistant layer 121. Utilizing the polar functional group bond, the conductive ink circuit can be easily attached to the TPU heat-resistant layer 121.

In an embodiment, the TPU surface layer 14 is disposed on the conductive layer 13 to cover the conductive layer 13. The TPU surface layer 14 has heat resistance, flexibility, abrasion resistance, high tensile strength and high extensibility. Therefore, the TPU surface layer 14 and the TPU heat-resistant layer 121 are utilized to cover the conductive layer 13 so as to avoid breaking the conductive circuit due to pulling. The thickness of the TPU surface layer 14 may be 0.1-0.2 mm. The thickness of the TPU surface layer 14 may be 0.1 mm.

Accordingly, utilizing the TPU complex layer 12 including the TPU heat-resistant layer 121 and the TPU melting layer 122, the conductive layer 13 does not contact directly with the base layer 11 to avoid breaking the conductive circuit of the conductive layer 13 when the base layer 11 is pulled. Therefore, the lifetime of the product can be increased. In addition, the TPU surface layer 14 and the TPU heat-resistant layer 121 are utilized to cover the conductive layer 13 to further avoid breaking the conductive circuit due to pulling.

FIG. 2 shows a flowchart of a manufacturing method of a conductive film according to an embodiment of the present invention. Referring to FIG. 1 and FIG. 2 together, with reference to step S21 first, a TPU surface layer 14 and a TPU complex layer 12 are prepared. The TPU complex layer 12 includes a TPU heat-resistant layer 121 and a TPU melting layer 122, and the TPU heat-resistant layer 121 is disposed on the TPU melting layer 122.

In an embodiment, the step of preparing the TPU surface layer 14 further includes: first TPU particles with the melting point of 70-180° C. and the Shore hardness of 50-95 A are utilized and dried at a set drying temperature for 6 hours so that the moisture content is 300 ppm or below. According to material characteristics, the setting range of the drying temperature is 60-100° C. Then, a first extruder (not shown) is utilized to melt the first TPU particles. According to material characteristics, the temperature setting range of the first extruder is 170° C.-215° C. According to material characteristics, the temperature setting range of a T-die head is 180° C.-200° C. Then, a first forming wheel (not shown) is utilized to prepare the TPU surface layer 14. The speed of the first forming wheel is 8.0 m/min.

In an embodiment, the step of preparing the TPU complex layer 12 further includes: second TPU particles with the melting point of 70-180° C. and the Shore hardness of 50-95 A are utilized and dried at a set drying temperature for 6 hours so that the moisture content is 300 ppm or below. According to material characteristics, the drying temperature setting range is 50-100° C. Third TPU particles with the melting point of 40-130° C. and the Shore hardness of 50-95 A are utilized and dried at a set drying temperature for 6 hours so that the moisture content is 300 ppm or below. The drying temperature setting range is 50-60° C.

Then, a second extruder (not shown) is utilized to melt the second TPU particles. According to material characteristics, the temperature setting range of the second extruder is 180° C.-215° C. A third extruder (not shown) is utilized to melt the third TPU particles. According to material characteristics, the temperature setting range of the third extruder is 130° C.-185° C. According to material characteristics, the temperature setting range of a T-die head is 185° C.-190° C.

A second forming wheel (not shown) is utilized to prepare the TPU heat-resistant layer 121 from the second extruder and the TPU melting layer 122 from the third extruder. The speed of the second forming wheel is 8.0 m/min.

In an embodiment, the manufacturing method of the conductive film of the present invention further includes a plasma treatment step so that one surface of the TPU heat-resistant layer 121 has a polar functional group bond.

With reference to step S22, a conductive layer 13 is printed on the TPU heat-resistant layer 121 of the TPU complex layer. In an embodiment, a conductive ink circuit of the conductive layer 13 is printed onto the polar functional group bond of the TPU heat-resistant layer 121.

With reference to step S23, the TPU surface layer 14, the TPU complex layer 12 on which the conductive layer 13 has been printed, and the base layer 11, which are stacked sequentially from top to bottom, are thermally bonded to prepare the conductive film 10 of the present invention. In an embodiment, the thermal bonding step further includes a step of utilizing a hot press (not shown) to perform thermal bonding. The thermal bonding temperature of the hot press is 100-140° C., the thermal bonding time is 30-60 seconds, and the bonding pressure is 5-10 kg/cm$^2$.

Therefore, utilizing different temperatures characteristics of the TPU heat-resistant layer 121 and the TPU melting layer 122 of the TPU complex layer 12, the conductive layer 13 is printed on the TPU heat-resistant layer 121 that is resistant to high temperature. In the manufacturing process, the TPU heat-resistant layer 121 will not be thermally contracted, so the circuit characteristics of the conductive layer will not be affected, and the yield of the product can be increased. In addition, the combination of the TPU melting layer 122 that is hot-melted and the base layer 11 can enhance the bonding force with the base layer 11 and avoid breaking the conductive circuit of the conductive layer 13 when the base layer 11 is pulled.

Embodiment 1

First TPU particles with the Shore hardness of 95 A and the melting point of 178° C. are dried at a set drying temperature of 100° C. for 6 hours to control the moisture content to 300 ppm or below. Then, a first extruder is utilized to melt the first TPU particles. The temperature of the first extruder is sequentially set to 180° C., 215° C. and 215° C., and the temperature of a T-die head is 200° C. Then, a first forming wheel is utilized to prepare the TPU surface layer 14. The speed of the first forming wheel is controlled at 8.0 m/min. The thickness of the TPU surface layer 14 is 0.1 mm. Afterwards, the TPU surface layer is rolled up and aged for 1-2 days to obtain the TPU surface layer 14.

Second TPU particles with the Shore hardness of 95 A and the melting point of 178° C. are dried at a set drying temperature of 100° C. for 6 hours to control the moisture content to 300 ppm or below. Third TPU particles with the Shore hardness of 80 A and the melting point of 90° C. are dried at a set drying temperature of 50° C. for 6 hours to control the moisture content to 300 ppm or below. A second extruder is utilized to melt the second TPU particles. The temperature of the second extruder is sequentially set to 180° C., 215° C. and 210° C. A third extruder is utilized to melt the third TPU particles. The temperature of the third extruder is sequentially set to 130° C., 175° C. and 175° C., and the temperature of a T-die head is 185° C. Then, the second forming wheel is utilized to prepare the TPU heat-resistant layer 121 from the second extruder and the TPU melting layer 122 from the third extruder. The speed of the second forming wheel is 8.0 m/min. The thickness of the TPU heat-resistant layer 121 is 0.05 mm, and the thickness of the TPU melting layer 122 is 0.1 mm. Afterwards, the TPU heat-resistant layer and the TPU melting layer are rolled up and aged for 1-2 days to obtain the TPU complex layer 12.

In a manner of printing, the conductive ink circuit that is extensible is printed on the TPU heat-resistant layer 121 of the TPU complex layer 12.

The TPU surface layer 14, the TPU complex layer 12 on which the conductive layer 13 has been printed, and the base layer 11 layer are stacked sequentially from top to bottom.

The TPU surface layer 14, the TPU complex layer 12 on which the conductive layer 13 has been printed, and the base layer 11 layer, which have been stacked, are thermally bonded by a hot press. The thermal bonding temperature of the hot press is 100-140° C., the thermal bonding time is 30-60 seconds, and the bonding pressure is 5-10 kg/cm², so that the conductive film 10 of the present invention is prepared.

Embodiment 2

First TPU particles with the Shore hardness of 83 A and the melting point of 159° C. are dried at a set drying temperature of 80° C. for 6 hours to control the moisture content to 300 ppm or below. Then, a first extruder is utilized to melt the first TPU particles. The temperature of the first extruder is sequentially set to 170° C., 190° C. and 190° C., and the temperature of a T-die head is 180° C. Then, a first forming wheel is utilized to prepare the TPU surface layer 14. The speed of the first forming wheel is controlled at 8.0 m/min. The thickness of the TPU surface layer 14 is 0.1 mm. Afterwards, the TPU surface layer is rolled up and aged for 1-2 days to obtain the TPU surface layer 14.

Second TPU particles with the Shore hardness of 83 A and the melting point of 159° C. are dried at a set drying temperature of 80° C. for 6 hours to control the moisture content to 300 ppm or below. Third TPU particles with the Shore hardness of 80 A and the melting point of 90° C. are dried at a set drying temperature of 50° C. for 6 hours to control the moisture content to 300 ppm or below. A second extruder is utilized to melt the second TPU particles. The temperature of the second extruder is sequentially set to 180° C., 215° C. and 210° C. A third extruder is utilized to melt the third TPU particles. The temperature of the third extruder is sequentially set to 130° C., 175° C. and 175° C., and the temperature of a T-die head is 185° C. Then, the second forming wheel is utilized to prepare the TPU heat-resistant layer 121 from the second extruder and the TPU melting layer 122 from the third extruder. The speed of the second forming wheel is 8.0 m/min. The thickness of the TPU heat-resistant layer 121 is 0.05 mm, and the thickness of the TPU melting layer 122 is 0.1 mm. Afterwards, the TPU heat-resistant layer and the TPU melting layer are rolled up and aged for 1-2 days to obtain the TPU complex layer 12.

In a manner of printing, the conductive ink circuit that is extensible is printed on the TPU heat-resistant layer 121 of the TPU complex layer 12.

The TPU surface layer 14, the TPU complex layer 12 on which the conductive layer 13 has been printed, and the base layer 11 layer are stacked sequentially from top to bottom.

The TPU surface layer 14, the TPU complex layer 12 on which the conductive layer 13 has been printed, and the base layer 11 layer, which have been stacked, are thermally bonded by a hot press. The thermal bonding temperature of the hot press is 100-140° C., the thermal bonding time is 30-60 seconds, and the bonding pressure is 5-10 kg/cm², so that the conductive film 10 of the present invention is prepared.

Embodiment 3

First TPU particles with the Shore hardness of 50 A and the melting point of 140° C. are dried at a set drying temperature of 60° C. for 6 hours to control the moisture content to 300 ppm or below. Then, a first extruder is utilized to melt the first TPU particles. The temperature of the first extruder is sequentially set to 180° C., 215° C. and 215° C., and the temperature of a T-die head is 180° C. Then, a first forming wheel is utilized to prepare the TPU surface layer 14. The speed of the first forming wheel is controlled at 8.0 m/min. The thickness of the TPU surface layer 14 is 0.1 mm. Afterwards, the TPU surface layer is rolled up and aged for 1-2 days to obtain the TPU surface layer 14.

Second TPU particles with the Shore hardness of 50 A and the melting point of 140° C. are dried at a set drying temperature of 50° C. for 6 hours to control the moisture content to 300 ppm or below. Third TPU particles with the Shore hardness of 80 A and the melting point of 90° C. are dried at a set drying temperature of 50° C. for 6 hours to control the moisture content to 300 ppm or below. A second extruder is utilized to melt the second TPU particles. The temperature of the second extruder is sequentially set to 180° C., 215° C. and 210° C. A third extruder is utilized to melt the third TPU particles. The temperature of the third extruder is sequentially set to 130° C., 175° C. and 175° C., and the temperature of a T-die head is 190° C. Then, the second forming wheel is utilized to prepare the TPU heat-resistant layer 121 from the second extruder and the TPU melting layer 122 from the third extruder. The speed of the second forming wheel is 8.0 m/min. The thickness of the TPU heat-resistant layer 121 is 0.05 mm, and the thickness of the TPU melting layer 122 is 0.1 mm. Afterwards, the TPU heat-resistant layer and the TPU melting layer are rolled up and aged for 1-2 days to obtain the TPU complex layer 12.

In a manner of printing, the conductive ink circuit that is extensible is printed on the TPU heat-resistant layer 121 of the TPU complex layer 12.

The TPU surface layer 14, the TPU complex layer 12 on which the conductive layer 13 has been printed, and the base layer 11 layer are stacked sequentially from top to bottom.

The TPU surface layer 14, the TPU complex layer 12 on which the conductive layer 13 has been printed, and the base layer 11 layer, which have been stacked, are thermally bonded by a hot press. The thermal bonding temperature of the hot press is 100-140° C., the thermal bonding time is 30-60 seconds, and the bonding pressure is 5-10 kg/cm², so that the conductive film 10 of the present invention is prepared.

Embodiment 4

First TPU particles with the Shore hardness of 83 A and the melting point of 159° C. are dried at a set drying temperature of 80° C. for 6 hours to control the moisture content to 300 ppm or below. Then, a first extruder is utilized to melt the first TPU particles. The temperature of the first extruder is sequentially set to 180° C., 215° C. and 215° C., and the temperature of a T-die head is 200° C. Then, a first forming wheel is utilized to prepare the TPU surface layer 14. The speed of the first forming wheel is controlled at 8.0 m/min. The thickness of the TPU surface layer 14 is 0.1 mm. Afterwards, the TPU surface layer is rolled up and aged for 1-2 days to obtain the TPU surface layer 14.

Second TPU particles with the Shore hardness of 95 A and the melting point of 178° C. are dried at a set drying temperature of 100° C. for 6 hours to control the moisture content to 300 ppm or below. Third TPU particles with the Shore hardness of 78 A and the melting point of 120° C. are dried at a set drying temperature of 50° C. for 6 hours to control the moisture content to 300 ppm or below. A second extruder is utilized to melt the second TPU particles. The temperature of the second extruder is sequentially set to 180° C., 215° C. and 210° C. A third extruder is utilized to melt the third TPU particles. The temperature of the third extruder is sequentially set to 130° C., 175° C. and 175° C., and the temperature of a T-die head is 190° C. Then, the second forming wheel is utilized to prepare the TPU heat-resistant layer 121 from the second extruder and the TPU melting layer 122 from the third extruder. The speed of the second forming wheel is 8.0 m/min. The thickness of the TPU heat-resistant layer 121 is 0.05 mm, and the thickness of the TPU melting layer 122 is 0.1 mm. Afterwards, the TPU heat-resistant layer and the TPU melting layer are rolled up and aged for 1-2 days to obtain the TPU complex layer 12.

In a manner of printing, the conductive ink circuit that is extensible is printed on the TPU heat-resistant layer 121 of the TPU complex layer 12.

The TPU surface layer 14, the TPU complex layer 12 on which the conductive layer 13 has been printed, and the base layer 11 layer are stacked sequentially from top to bottom.

The TPU surface layer 14, the TPU complex layer 12 on which the conductive layer 13 has been printed, and the base layer 11 layer, which have been stacked, are thermally bonded by a hot press. The thermal bonding temperature of the hot press is 100-140° C., the thermal bonding time is 30-60 seconds, and the bonding pressure is 5-10 kg/cm², so that the conductive film 10 of the present invention is prepared.

Embodiment 5

First TPU particles with the Shore hardness of 50 A and the melting point of 140° C. are dried at a set drying temperature of 60° C. for 6 hours to control the moisture content to 300 ppm or below. Then, a first extruder is utilized to melt the first TPU particles. The temperature of the first extruder is sequentially set to 180° C., 215° C. and 215° C., and the temperature of a T-die head is 200° C. Then, a first forming wheel is utilized to prepare the TPU surface layer 14. The speed of the first forming wheel is controlled at 8.0 m/min. The thickness of the TPU surface layer 14 is 0.1 mm. Afterwards, the TPU surface layer is rolled up and aged for 1-2 days to obtain the TPU surface layer 14.

Second TPU particles with the Shore hardness of 83 A and the melting point of 159° C. are dried at a set drying temperature of 80° C. for 6 hours to control the moisture content to 300 ppm or below. Third TPU particles with the Shore hardness of 78 A and the melting point of 120° C. are dried at a set drying temperature of 50° C. for 6 hours to control the moisture content to 300 ppm or below. A second extruder is utilized to melt the second TPU particles. The temperature of the second extruder is sequentially set to 180° C., 215° C. and 210° C. A third extruder is utilized to melt the third TPU particles. The temperature of the third extruder is sequentially set to 130° C., 185° C. and 185° C., and the temperature of a T-die head is 190° C. Then, the second forming wheel is utilized to prepare the TPU heat-resistant layer 121 from the second extruder and the TPU melting layer 122 from the third extruder. The speed of the second forming wheel is 8.0 m/min. The thickness of the TPU heat-resistant layer 121 is 0.05 mm, and the thickness of the TPU melting layer 122 is 0.1 mm. Afterwards, the TPU heat-resistant layer and the TPU melting layer are rolled up and aged for 1-2 days to obtain the TPU complex layer 12.

In a manner of printing, the conductive ink circuit that is extensible is printed on the TPU heat-resistant layer 121 of the TPU complex layer 12.

The TPU surface layer 14, the TPU complex layer 12 on which the conductive layer 13 has been printed, and the base layer 11 layer are stacked sequentially from top to bottom.

The TPU surface layer 14, the TPU complex layer 12 on which the conductive layer 13 has been printed, and the base layer 11 layer, which have been stacked, are thermally bonded by a hot press. The thermal bonding temperature of the hot press is 100-140° C., the thermal bonding time is 30-60 seconds, and the bonding pressure is 5-10 kg/cm², so that the conductive film 10 of the present invention is prepared.

Moreover, the scope of the present application is not intended to be limited to the particular embodiments of the process, machine, manufacture, and composition of matter, means, methods and steps described in the specification. As those skilled in the art will readily appreciate form the present disclosure, processes, machines, manufacture, compositions of matter, means, methods, or steps, presently existing or later to be developed, that perform substantially the same function or achieve substantially the same result as the corresponding embodiments described herein may be utilized in accordance with some embodiments of the present disclosure.

Accordingly, the appended claims are intended to include within their scope such processes, machines, manufacture, and compositions of matter, means, methods or steps. In addition, each claim constitutes a separate embodiment, and the combination of various claims and embodiments are within the scope of the invention.

What is claimed is:

1. A conductive film, comprising:

a base layer;

a thermoplastic polyurethane (TPU) complex layer, having a TPU heat-resistant layer and a TPU melting layer, the TPU heat-resistant layer disposed on the TPU melting layer, and the TPU melting layer disposed on the base layer;

a conductive layer, having a conductive circuit, and the conductive circuit disposed on the TPU heat-resistant layer of the TPU complex layer and free from directly contacting the base layer; and a TPU surface layer, disposed on the conductive layer and prepared by melting first TPU particles with a melting point of 70-180° C., a Shore hardness of 50-95 A, and a moisture content below 300 ppm.

2. The conductive film of claim 1, wherein the base layer is a woven fabric layer.

3. The conductive film of claim 1, wherein the conductive circuit is a conductive ink circuit.

4. The conductive film of claim 1, wherein the thickness of the TPU heat-resistant layer is 0.05-0.10 mm.

5. The conductive film of claim 1, wherein the thickness of the TPU melting layer is 0.10-0.20 mm.

6. The conductive film of claim 1, wherein the thickness of the TPU surface layer is 0.1-0.2 mm.

7. The conductive film of claim 1, wherein the TPU heat-resistant layer further comprises a polar functional group bond disposed on a surface of the TPU heat-resistant layer.

8. The conductive film of claim 7, wherein the conductive ink circuit is disposed on the polar functional group bond of the TPU heat-resistant layer.

\* \* \* \* \*